United States Patent
Chien et al.

(10) Patent No.: US 6,365,504 B1
(45) Date of Patent: Apr. 2, 2002

(54) SELF ALIGNED DUAL DAMASCENE METHOD

(75) Inventors: Wu Kuo Chien, Miao-Li Hsien; Chen Hsi Chieh, Hsin Chu Hsien; Chen Han Ping, Hsinchu, all of (TW)

(73) Assignee: TSMC-ACER Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/418,840

(22) Filed: Oct. 15, 1999

(51) Int. Cl.$^7$ .......................................... H01L 21/4763
(52) U.S. Cl. ...................... 438/624; 438/634; 438/637; 438/638; 438/639; 438/666; 438/668; 438/700; 438/740
(58) Field of Search ................................ 438/624, 634, 438/637, 638, 639, 666, 668, 700, 740

(56) References Cited

U.S. PATENT DOCUMENTS

| | | | | |
|---|---|---|---|---|
| 4,977,105 A | * | 12/1990 | Okamoto et al. | 438/639 |
| 5,614,765 A | | 3/1997 | Avanzino et al. | 257/774 |
| 5,719,089 A | * | 2/1998 | Cherng et al. | 438/637 |
| 5,795,823 A | | 8/1998 | Avanzino et al. | 438/639 |
| 6,066,556 A | * | 5/2000 | Jeong | 438/639 |
| 6,087,252 A | * | 7/2000 | Lu | 438/638 |
| 6,177,347 B1 | * | 1/2001 | Liu et al. | 438/637 |
| 6,187,663 B1 | * | 2/2001 | Yu et al. | 438/624 |
| 6,211,063 B1 | * | 4/2001 | Liu et al. | 438/624 |
| 6,242,340 B1 | * | 6/2001 | Lee | 438/624 |

* cited by examiner

Primary Examiner—John F. Niebling
Assistant Examiner—Lynne Gurley
(74) Attorney, Agent, or Firm—Sughrue Mion, PLLC

(57) ABSTRACT

A method for fabricating an interconnection between a conductive line and a via plug on an insulating layer, comprises the steps of: forming a conductive line pattern on the insulating layer; etching the upper part of the insulating layer and forming a conductive line opening; forming conductive line spacers to provide better alignment between the conductive line and the via, to provide better control of a small via, and to help the metal to have better coverage effects in filling in the conductive line opening and the via; producing a via pattern on the insulating layer and the via pattern opening being substantially larger than the conductive line opening; etching the exposed lower part of the insulating layer by utilizing the conductive line spacers as an etching mask and forming a via hole; and filling the conductive line opening and the via hole with a conductive material and forming an interconnection of the conductive line and a via plug.

14 Claims, 4 Drawing Sheets

SELF ALIGNED DUAL DAMASCENE METHOD

BACKGROUND OF THE INVENTION

1. Field of the Invention

The present invention relates to a dual damascene method for producing conductive lines and via plugs, and more particularly, to a self aligned dual damascene method for interconnecting metal conductive lines and via plugs in integrated circuits of semiconductor devices so as to connect metal conductive lines in multilayers.

2. Description of the Prior Art

After producing active and/or passive devices on a semiconductor substrate, metal conductive lines on the devices should be connected. The metal conductive lines are usually laid in multilayer forms. As the integration density of semiconductor devices increases, the interconnection of metal lines in different layers plays an important role and impacts on device performance.

The dual damascene method, which mainly deposits and fills metal conductive line openings and via holes between metal conductive lines with a conductive material in one step, is applied to connect metal lines of multilayers in semiconductor devices. Such a method has improved the process of the conventional interconnection between metal conductive lines. For example, in the method, processing steps have been decreased. However, the dual damascene method still needs to be improved to meet stricter process requirements and challenges.

Steps of a conventional self aligned dual damascene method are shown in FIGS. 1a to 1d. First, as shown in FIG. 1a, a first etch stop layer 4 on a second insulating layer 3 is etched by utilizing a second photoresist 10 of via pattern as an etching mask. This step is used for fabricating a via hole in the subsequent steps. Then, as shown in FIG. 1b, after the second photoresist 10 is removed and a third insulating layer 5 is deposited, a first photoresist 7 is deposited on the third insulating layer 5 and a second conductive line is patterned thereon. In FIG. 1c, by utilizing the first photoresist 7 and the first etch stop layer 4 as an etching mask, the third insulating layer 5 and the second insulating layer 3 are etched and a conductive line opening 8 and a via hole 11 are formed. Then as shown in FIG. 1d, a conductive material is filled in the second conductive line opening and the via hole and an interconnection of a second conductive line 12 and a via plug 13 are formed. Finally, a second etch stop layer 6 is formed on the surface of the third insulating layer 5 and the second conductive line 12.

The conventional self aligned dual damascene method has some disadvantages and is restricted in further developments when facing the requirements of smaller critical dimensions. For example, there are some difficulties in patterning the second photoresist 10 of via holes for photolithographic and etching processes. The shrunken dimensions of via holes and process windows make manufacturing processes more difficult. Furthermore, a high aspect ratio increases difficulties in etching. The overlay tolerances in patterning the first photoresist 10 and the second photoresist 7 must be strictly controlled, otherwise misalignment will be occurred, and the first etching stop layer 4 under the second conductive line opening 8 will be overetched and the second insulating layer 3 will be damaged when the third insulating layer 5 and the second insulating layer 3 are etched to form the second conductive line opening 8 and the via hole 11. Therefore, the size and the pattern of the via hole 11 are hard to control.

U.S. Pat. Nos. 5,614,765 and 5,795,823 respectively disclose a self aligned via dual damascene structure and a method for forming the same. In the method, conductive lines are first patterned. The mask pattern of the conductive lines contains laterally enlarged area where via openings are to be formed. After the conductive line openings with laterally enlarged areas are created, the openings are filled with a conformal material whose etch selectivity is different with respect to the one of the insulating underlayer. The conformal material is etched to form sidewalls in the enlarged area. Then the exposed insulating layer under the sidewalls is etched and via openings are formed. In the latter step, the conductive line openings and vias are filled with a conductive material. Although one mask applied in the method can be omitted the enlarged areas increase difficulties in designing circuits in such tight space; partial conductive line openings are subject to damage in etching via openings; and the residual conformal material may result in bad electric performance if the conformal material is not thoroughly removed.

The present invention discloses a novel self aligned dual damascene method which can solve the above-mentioned disadvantages of the prior art.

SUMMARY OF THE INVENTION

An object of the present invention is to provide a novel and improved self aligned dual damascene method for increasing process windows of via photolithographic process. The process is suitable for smaller line width and can produce small-sized via in a less strict process condition.

Another object of the present invention is to provide a novel and improved self aligned dual damascene method for decreasing etching aspect ratio such that small via holes can be etched completely.

A further object of the present invention is to provide a novel and improved self aligned dual damascene method for providing symmetric metal conductive lines extending on vias. The overlay tolerances caused by the misalignment between a conductive line mask and a via mask can be avoided. Product yields can be significantly increased. And the method can be applied to smaller line width processes.

A still further object of the present invention is to provide a novel and improved self aligned dual damascene method for applying to low dielectric constant material processes. A part of the low dielectric constant material which does not need to be etched can be protected from the etching damage.

To achieve the above objects and overcome disadvantages of the prior art, the present invention discloses a method for fabricating an interconnection between a conductive line and a via plug on an insulating layer. The method comprises the following steps: First, a conductive line pattern is formed on the insulating layer. Then the upper part of the insulating layer is etched and the conductive line pattern is formed on the insulating layer and a conductive line opening is formed. Then a protective layer is deposited on sidewalls of the conductive line opening and conductive line spacers on the sidewalls are formed. A via pattern is formed on the insulating layer above the conductive line spacers. The opening of the via pattern is substantially larger than the width of the conductive line opening. The substantially enlarged via pattern expands the process windows of the via photolithographic process and makes it possible to produce a smaller line width interconnection. The lower part of the insulating layer exposed between the conductive line spacers is etched by utilizing the conductive line spacers as an etching mask such that the upper part of the insulating layer is protected. Then a via hole is formed. The conductive line spacers protect the insulating layer from being etched and allow the low dielectric constant material processes to be performed. And, the conductive line opening and a via hole are filled with a conductive material. An interconnection of the conductive line and a via plug is formed. The introduction of the conductive line spacers not only provides better alignment between the conductive lines and vias but also provide better control of a small via and provides better coverage effects in depositing and filling metal between the conductive line openings and via holes.

BRIEF DESCRIPTION OF THE DRAWINGS

The foregoing and other objects, characteristics and efficiency can be better understood form the following detailed descriptions of the invention with reference to the drawings, in which:

FIGS. 1a to 1d depict steps of a conventional self aligned dual damascene method, wherein:

FIG. 1a depicts a step of etching a first etch stop layer by utilizing a second photoresist as an etching mask;

FIG. 1b depicts a step of patterning a second conductive line by utilizing a first photoresist;

FIG. 1c depicts a step of etching and forming second conductive line openings and via holes by utilizing the first photoresist and the first etch stop layer as an etching mask;

FIG. 1d depicts a step of filling the second conductive line openings and the via holes with a conductive material and forming an interconnection of second conductive lines and via plugs;

FIGS. 2a to 2g depict steps of a novel self aligned dual damascene method according to one embodiment of the present invention, wherein:

FIG. 2a depicts a step of forming a structure for forming a conductive line and a via plug thereon;

FIG. 2b depicts a step of producing a second conductive line pattern by utilizing a first photoresist;

FIG. 2c depicts a step of first etching a second etch stop layer and a third insulating layer to form a second line opening and removing the first photoresist;

FIG. 2d depicts a step of depositing a protective layer and forming second conductive line spacers;

FIG. 2e depicts a step of patterning a via by utilizing a second photoresist;

FIG. 2f depicts a step of second etching a first etch stop layer and a second insulating layer to form a via hole and removing the second photoresist; and FIG. 2g depicts a step of filling the second conductive line opening and the via hole with a conductive material and forming an interconnection of the second conductive line and a via plug.

DETAILED DESCRIPTION OF THE INVENTION

Figure 1A:
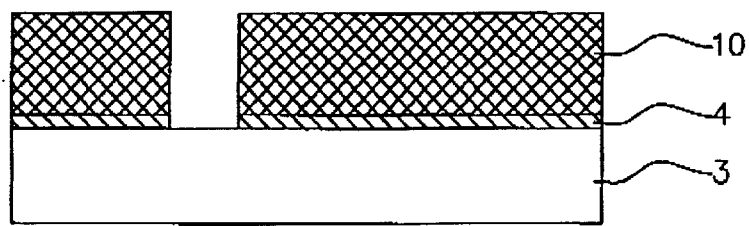
Figure 1B:
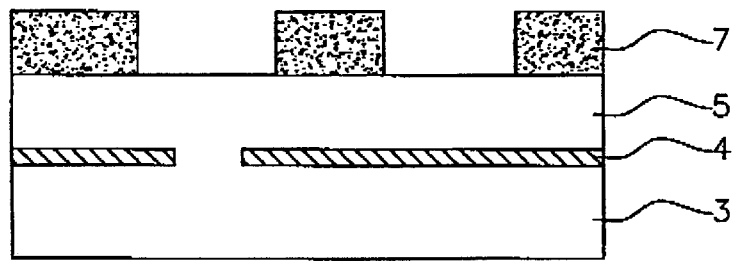
Figure 1C:
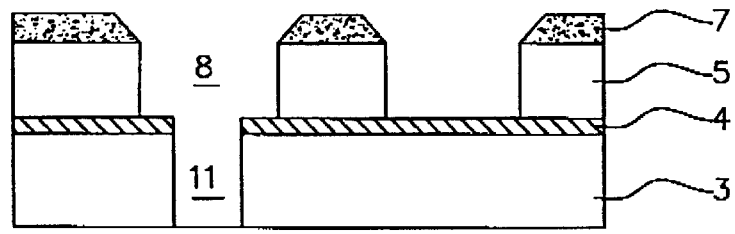
Figure 1D:
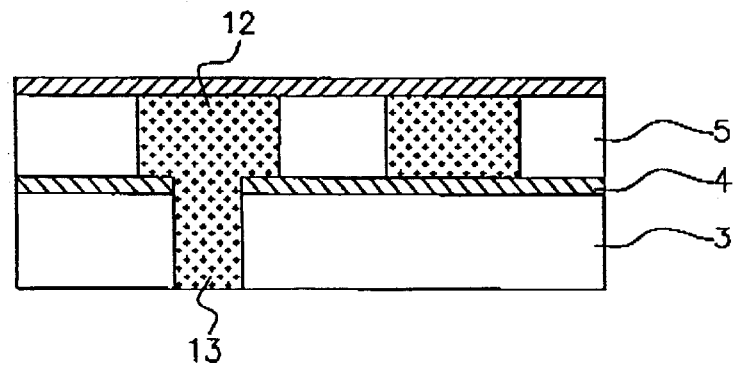
Figure 2A:
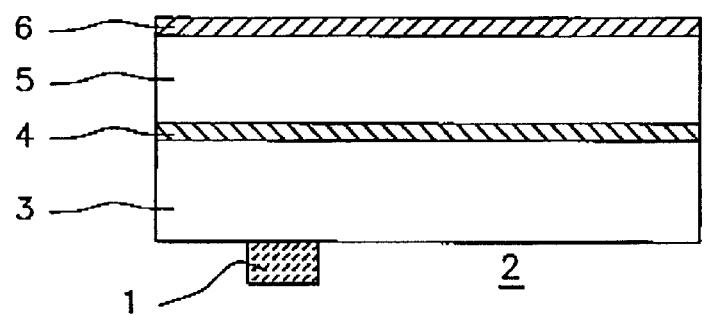

Steps for a novel self aligned dual damascene method according to one embodiment of the present invention are described with reference to FIGS. 2a to 2g. FIG. 2a depicts a step of forming a structure for forming a conductive line and a via plug thereon. The structure is on a first conductive line 1 and a first insulating layer 2 and comprises in a sequence from bottom to top a second insulating layer 3, a first etch stop layer 4, a third insulating layer 5 and a second etch stop layer 6. In the structure, part of the second insulating layer 3 is to be etched and opened for forming a via hole and part of the third insulating layer 5 is to be etched and opened for forming a second conductive line opening. The first etch stop layer 4 between the second and the third insulating layers is used for protecting the second insulating layer 3 from damage of overreaching when etched to form the second conductive line opening. There may be an etch stop layer between the first insulating layer 2 and the second insulating layer 3 in some embodiments for preventing overreaching. The insulating layers can be oxides or low dielectric constant materials, and particularly the second and the third insulating layers are selected from the group consisting of oxides and low dielectric constant materials. The first and the second etch stop layers can be silicon nitride.

Figure 2B:
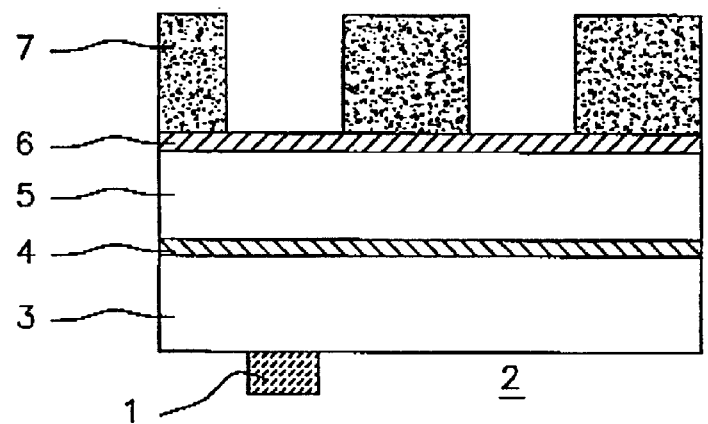

FIG. 2b depicts a step of producing a second conductive line pattern by utilizing a first photoresist 7 formed on the second etch stop layer 6. Photoresist is first coated on the second etch stop layer 6 and after photolithographic processes such as exposure and development, a second conductive line pattern is formed.

Figure 2C:
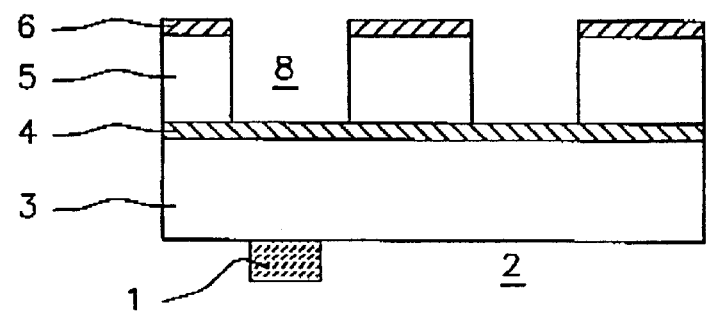

FIG. 2c depicts a step of first etching a second etch stop layer 6 and a third insulating layer 5 to form a second line opening 8 and removing the first photoresist 7. The first etching step etches the second etch stop layer 6 and the third insulating layer 5 by utilizing the first photoresist 7 as an etching mask and stops at the first etch stop layer 4. The second conductive line opening 8 is thus formed. After removing the first photoresist, the structure is as shown in FIG. 2c.

Figure 2D:
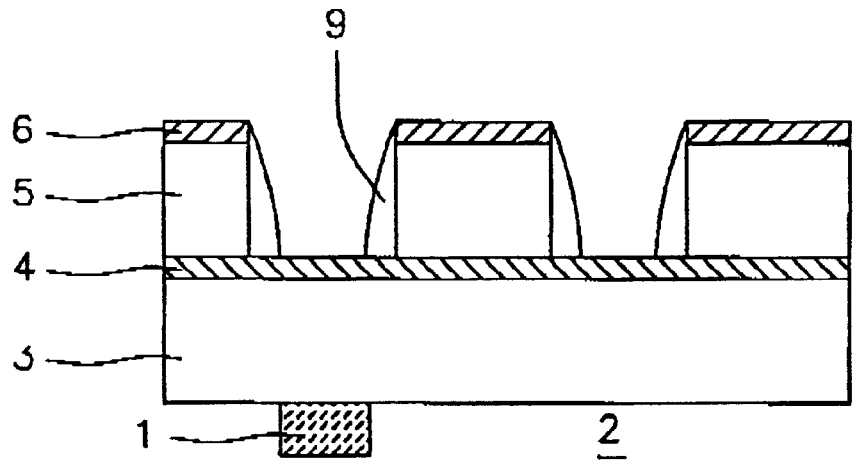

FIG. 2d depicts a step of depositing a protective layer and forming second conductive line spacers 9. This can be done by depositing a protective layer on the second etch stop layer 6 and the sidewalls of the second conductive line opening 8 and by further removing the protective layer on the second etch stop layer 6. The second conductive line spacers 9 are thus formed. The composition of the protective layer can be silicon nitride and the deposition can be done by chemical vapor deposition (CVD).

The second conductive line spacers 9 provide an easier controlled alignment. The alignment is a frequently encountered problem which is needed to be solved in the dual damascene method. By depositing a layer of conformal silicon nitride, the second conductive line spacer 9 on one side of the second conductive line opening 8 is symmetric to the one on the other side. The symmetric second conductive line spacers 9 will ensure the via hole to be positioned at the center of the second conductive line opening 8. The misalignment can be reduced and thus the process window can be extended and the manufacturing processes can be controlled.

Figure 2E:
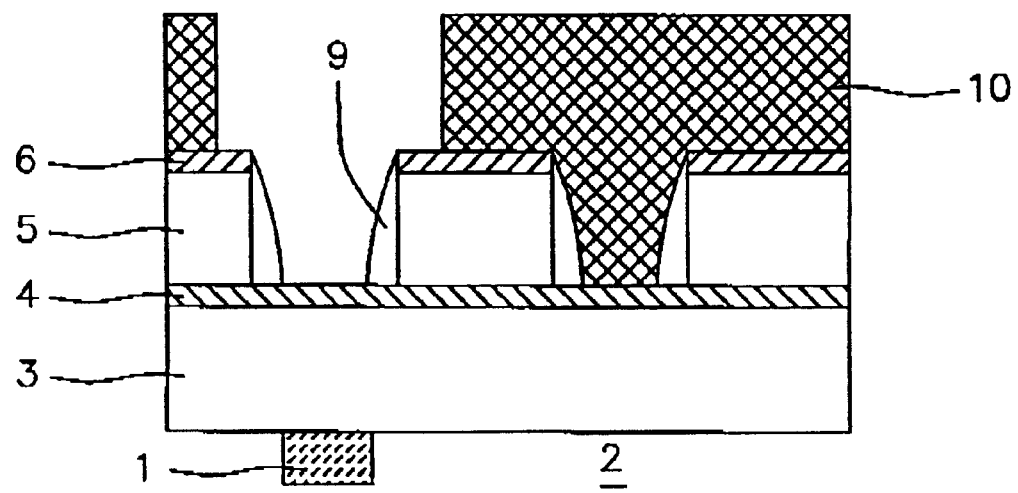

FIG. 2e depicts a step of forming a via pattern by utilizing a second photoresist. The opening of the via pattern is substantially larger than the width of the conductive line opening 8 and is on the second conductive line spacers 9. The enlarged opening of the via pattern, which is substantially larger than the width of the conductive line opening 8, allows the photolithographic process to form via holes easily, especially in forming small via holes. The main reason why the opening of the via pattern can be enlarged is the self alignment provided by the second conductive line spacers 9 and an etching masking effect provided in the next step.

Figure 2F:
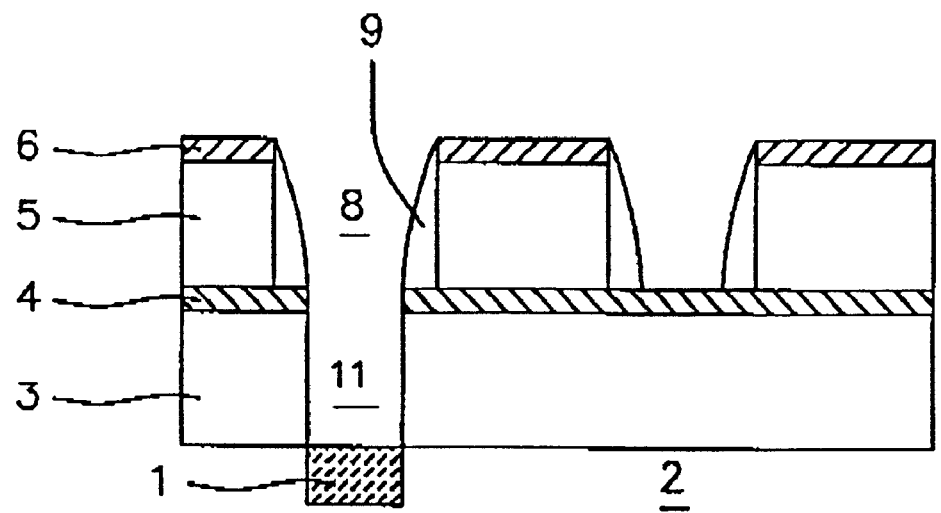

FIG. 2f depicts a step of second etching a first etch stop layer 4 and a second insulating layer 3 by utilizing the second photoresist 10 and the second conductive line spacers 9 as an etching mask. The second etching process stops at the first conductive line 1. After a via hole 11 is formed, the second photoresist 10 is removed. Because of the etch masking effects provided by the second conductive line spacers 9, the second insulating layer 3 under the sidewalls of the second conductive line opening 8 is prevented from damage by etching. The etching process can thus be proceeded smoothly. Furthermore, the self alignment effects provide by the second conductive line spacers 9 solve problems of misalignment in forming small via holes and aid the process control.

Figure 2G:
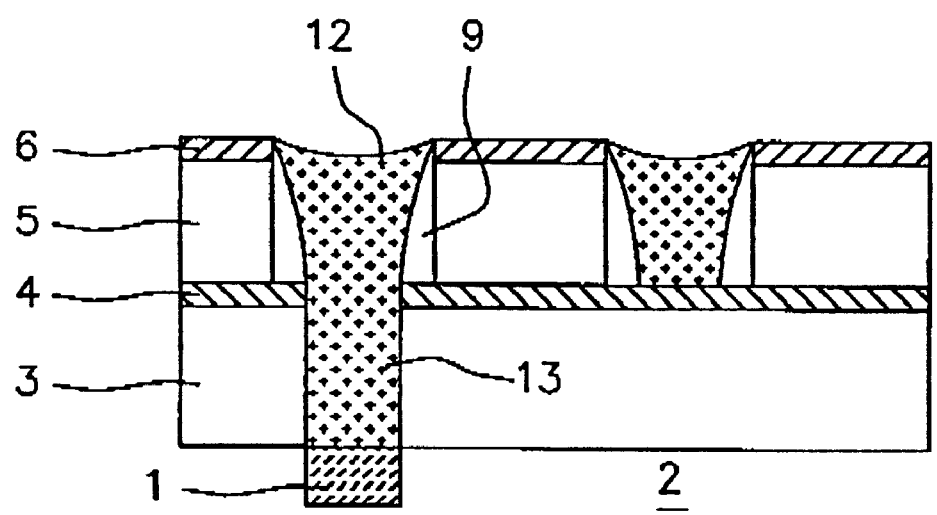

FIG. 2g depicts a step of filling the second conductive line opening 8 and the via hole 11 with a conductive material and forming an interconnection of a second conductive line 12 and a via plug 13. The second conductive line 12 particularly refers to the conductive line portion after the conductive material fills the second conductive line opening 8. The via plug 13 particularly refers to the plug portion after the conductive material fills the via hole 11. The bottom of the via plug 13 connects the first conductive line 1 and whereby the first conductive line 1 and the second conductive line 12 are electrically connected and the object of the interconnection is achieved. The conductive material is generally metal, particularly aluminum, copper, or alloy including aluminum or copper. In order to avoid metal, particularly copper, scattering to the insulating layers, the method of the present invention further includes a step of depositing a barrier layer after the step of forming via hole 11 and before the step of filling the second conductive line opening 8 and via hole 11 with the conductive material. The deposition of the barrier layer can be done by physical vapor deposition (PVD) and the material of the barrier layer is generally a tantalum compound, such as tantalum metal or tantalum nitride.

The problems of poor metal coverage and voids when filling the second conductive line opening 8 and the via hole 11 with the conductive material can be avoided according to the present invention. The metal filling efficiency and reliability can be improved. This is because the conductive material, particularly metal, can flow easily along the slanting sidewall of the second conductive line spacers 9 to cover and fill the second conductive line opening 8 and the via hole 11.

In the other embodiment of the present invention applied in a design rule less than 0.25 $\mu$m, the width of the first conductive line 1 is 0.17 $\mu$m, the size of the via hole 11 is 0.18 $\mu$m, the width of the second conductive line opening 8 is 0.2 $\mu$m, and the width of each side of the second conductive line spacers 9 is 0.01 $\mu$m. For a thin second conductive line spacer, the resistivity of the metal conductive line will not cause significant effects. Particularly in applying copper processes, the influence is much less than the standard methods. Furthermore, a small via hole can be obtained by shrinking the width of the second conductive line opening. Accordingly, by the novel self aligned dual damascene method disclosed in the present invention, not only the disadvantages of the prior art can be avoided but also an advanced dual damascene process can be applied to smaller line width processes and the processes are easily controlled.

In the drawings and specification, typical embodiments of the present invention have been disclosed, and, although specific terms have been employed, they have been used in a generic and descriptive sense only and not for purposes of limitation, the scope of the invention being set forth in the following claims.

What is claimed is:

1. A method for fabricating an interconnection between a conductive line and a via plug on an insulating layer, comprising the steps of:
   (a) forming a conductive line pattern on a upper part of the insulating layer;
   (b) etching the upper part of the insulating layer and forming a conductive line opening in the upper part of the insulating layer;
   (c) depositing spacers on the sidewalls of the conductive line opening;
   (d) formiing a via pattern on the upper part of the insulating layer; the opening of the via pattern being substantially larger than the width of the conductive line opening;
   (e) etching a lower part of the insulating layer exposed between the spacers and forming a via hole; and
   (f) filling the conductive line opening and the via hole with a conductive material and forming an interconnection of the conductive line and the via plug.

2. The method of claim 1, wherein the insulating layer further comprises an etch stop layer between the upper part and the lower part thereof.

3. The method of claim 1, wherein the insulating layer further comprises an etch stop layer between the upper part of the insulating layer and the conductive line pattern.

4. The method of claim 1, wherein the bottom of the via plug further comprises a conductive line layer and the via plug is electrically connected to the conductive line layer.

5. The method of claim 1, wherein the insulating layer is an oxide layer.

6. The method of claim 1, wherein the insulating layer is a low dielectric constant material.

7. The method of claim 1, further comprising a step of depositing a barrier layer between the steps (e) and (f).

8. The method of claim 7, wherein the barrier layer is composed of a tantalum compound.

9. A dual damascene method for producing a conductive line and a via plug, comprising the steps of:
   (a) forming a second conductive line pattern by applying a first photoresist on a structure to be formed the conductive line and the via plug thereon, wherein the structure locates on a first conductive line and a first insulating layer and comprises in a sequence from bottom to top a second insulating layer, a first etch stop layer, a third insulating layer and a second etch stop layer, wherein the first photoresist is formed on the second etch stop layer;
   (b) utilizing the first photoresist as an etching mask and etching the second etch stop layer and the third insulating layer, the etching process stopping at the first etch stop layer and a second conductive line opening being formed;
   (c) removing the first photoresist;
   (d) forming second spacers on the first etch stop layer and the sidewalls of the second conductive line opening;
   (e) forming a via pattern on the second etch stop layer by a second photoresist;
   (f) utilizing the second photoresist and the second spacers as an etching mask and etching the first etch stop layer and the second insulating layer, the etching process stopping at the first conductive line and a via hole being formed;
   (g) removing the second photoresist; and
   (h) filling the second conductive line opening and the via hole with a conductive material and forming an interconnection of the second conductive line and the via plug.

10. The dual damascene method of claim 9, wherein the first and the second etch stop layers are composed of silicon nitride.

11. The dual damascene method of claim 9, wherein the second insulating layer is selected from the group consisting of oxide and low dielectric constant materials.

12. The dual damascene method of claim 9, wherein the third insulating layer is selected from the group consisting of oxide and low dielectric constant materials.

13. The dual damascene method of claim 9, further comprises a step of depositing a barrier layer between the steps (g) and (h).

14. The dual damascene method of claim 13, wherein the barrier layer is composed of tantalum compound.

* * * * *